US011764806B2

(12) United States Patent
Vitthal et al.

(10) Patent No.: US 11,764,806 B2
(45) Date of Patent: Sep. 19, 2023

(54) DATA COMPRESSION SYSTEM AND METHOD OF USING

(71) Applicant: NEC CORPORATION, Tokyo (JP)

(72) Inventors: Charvi Vitthal, Tokyo (JP); Florian Beye, Tokyo (JP); Koichi Nihei, Tokyo (JP); Hayato Itsumi, Tokyo (JP); Takanori Iwai, Tokyo (JP)

(73) Assignee: NEC CORPORATION, Tokyo (JP)

( * ) Notice: Subject to any disclaimer, the term of this patent is extended or adjusted under 35 U.S.C. 154(b) by 67 days.

(21) Appl. No.: 17/467,282

(22) Filed: Sep. 6, 2021

(65) Prior Publication Data

US 2023/0070944 A1    Mar. 9, 2023

(51) Int. Cl.
*H03M 7/00* (2006.01)
*H03M 7/30* (2006.01)
*G06F 18/214* (2023.01)

(52) U.S. Cl.
CPC ........ *H03M 7/6005* (2013.01); *G06F 18/214* (2023.01); *H03M 7/3059* (2013.01); *H03M 7/3066* (2013.01); *H03M 7/6011* (2013.01)

(58) Field of Classification Search
CPC ............. H03M 7/6005; H03M 7/3059; H03M 7/3066; H03M 7/6011; G06K 9/6256
USPC ..................................................... 341/50, 51
See application file for complete search history.

(56) References Cited

U.S. PATENT DOCUMENTS

| | | | | |
|---|---|---|---|---|
| 10,429,486 | B1 * | 10/2019 | O'Shea | G01S 5/0268 |
| 10,552,738 | B2 * | 2/2020 | Holt | G06N 3/0454 |
| 10,965,948 | B1 * | 3/2021 | Appalaraju | H04N 19/124 |
| 11,490,085 | B2 * | 11/2022 | Jiang | G06N 5/045 |

(Continued)

FOREIGN PATENT DOCUMENTS

| | | |
|---|---|---|
| EP | 3438776 A1 | 2/2019 |
| EP | 3716210 A1 | 9/2020 |

(Continued)

OTHER PUBLICATIONS

Xuebin Su et al., "A Novel Point Cloud Compression Algorithm Based on Clustering", IEEE Robotics and Automation Letters, Apr. 2019, pp. 2132-2139, vol. 4, No. 2, 8pp.

(Continued)

*Primary Examiner* — Jean B J Lau G Ean De
(74) *Attorney, Agent, or Firm* — HAUPTMAN HAM, LLP

(57) ABSTRACT

A system includes a non-transitory computer readable medium configured to store instructions thereon; and a processor connected to the non-transitory computer readable medium. The processor is configured to execute the instructions for generating a mask based on received data from a sensor, wherein the mask includes a plurality of importance values, and each region of the received data is designated a corresponding importance value of the plurality of importance values. The processor is configured to execute the instructions for encoding the received data based on the mask; and transmitting the encoded data to a decoder for defining reconstructed data. The processor is configured to execute the instructions for computing a loss based on the reconstructed data, the received data and the mask. The processor is configured to execute the instructions for providing training to an encoder for encoding the received data based on the computed loss.

20 Claims, 10 Drawing Sheets

(56) References Cited

U.S. PATENT DOCUMENTS

| | | | |
|---|---|---|---|
| 2014/0112591 A1* | 4/2014 | Kalevo | H04N 19/176 382/233 |
| 2019/0087978 A1 | 3/2019 | Tourapis et al. | |
| 2019/0340775 A1 | 11/2019 | Lee et al. | |
| 2020/0226797 A1 | 7/2020 | Schroers et al. | |
| 2020/0304835 A1 | 9/2020 | Liu et al. | |
| 2020/0401817 A1 | 12/2020 | Schroeter | |

FOREIGN PATENT DOCUMENTS

| | | |
|---|---|---|
| JP | 2022129683 A | 9/2022 |
| WO | 2021152849 A1 | 8/2021 |

OTHER PUBLICATIONS

Bi-Ke Chen et al., "Importance-Aware Semantic Segmentation for Autonomous Driving System", Proceedings of the Twenty-Sixth International Joint Conference on Artificial Intelligence (IJCAI-17), 2017, pp. 1504-1510, 7pp.

International Search Report in PCT/JP2022/028441, dated Oct. 18, 2022. 3pp.

* cited by examiner

330

340

|   |   |   |
|---|---|---|
| 0.4 | 0.4 | 0.5 |
| 0 | 0.6 | 0.7 |
| 0 | 0.6 | 0.7 |
| 0 | 0.7 | 1 |

DATA COMPRESSION SYSTEM AND METHOD OF USING

BACKGROUND

Autonomous driving involves collecting data from sensors, processing that data and transmitting that data from one location to another. An amount of data collected by the sensors is extremely large. As a result, tree-based representations have been used in some system in order to help reduce an amount of data being transmitted and processed. The data compression techniques in some systems compress all of the data received from the sensors.

Examples of the type of sensors used to collect the data include light detection and ranging (LiDAR) sensors. A LiDAR sensor emits beams of light at predetermined intervals. The emitted beams contact objects and are reflected back to the sensor. Based on a time between emission and detection, the LiDAR sensor is able to determine the distance between the object and the sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3D is a mask applicable to sensor data in accordance with some embodiments.

DETAILED DESCRIPTION

Figure 1:
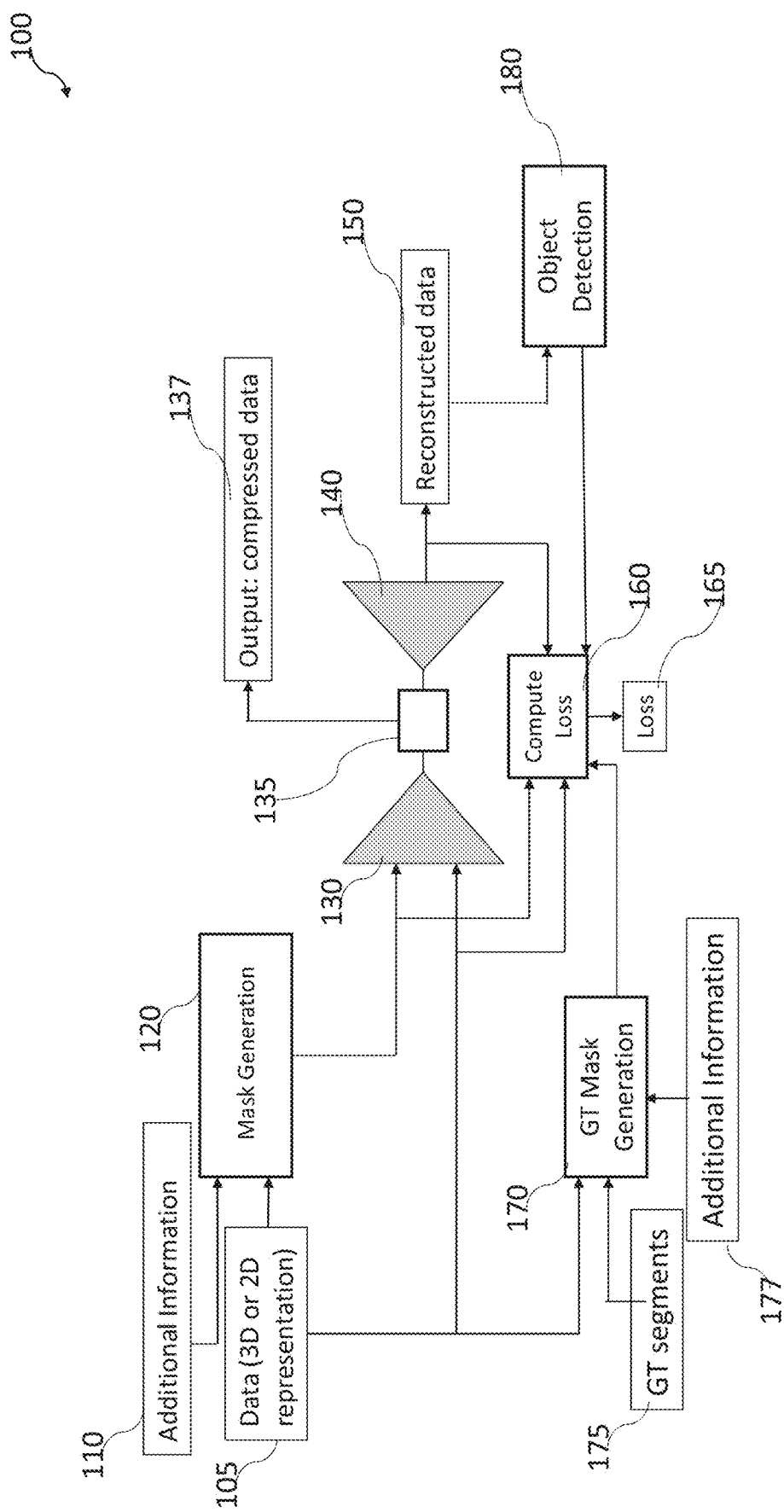
FIG. 1 is a schematic diagram of a data compression system in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Use of the term "and/or" means that each option is usable individually or in combination with any, or all, of the other options.

Autonomous driving or remote monitoring of driving conditions or apparatus involves receiving data from sensors then processing and transmitting the data in a timely manner in order to identify and account for continually varying conditions surrounding a vehicle. Compressing the data received from the sensors helps to reduce the time for transmitting the information. Comprising and transmitting large amounts of data still produces some lag time and increases a risk of incorrect data upon decoding of the compressed data. By generating masks based on the data received by the sensor and applying the mask at the transmission of the data, i.e., by an encoder, further reductions in processing and transmitting times will help to improve the speed and precision of data utilized for autonomous driving and remoting monitoring.

Applying masks to the data to be transmitted helps to remove portions of the received data or reduce the importance of portions of the received data. By targeting portions of the received data that is likely to have the most significant impact on the vehicle, the amount of data to be processed and transmitted is reduced. As a result, processing load, transmission load and lag time are decreased. The autonomous driving or remote monitoring is therefore able to be more responsive to the highest importance and most relevant detected objects. Also, the reduced amount of data transmitted reduces a risk of error in decoding the transmitted data.

The masks are developed and updated using artificial intelligence (AI), in some embodiments. In addition, user input information is able to further clarify and tune the mask. In some embodiments, the masks are developed based on a combination of rules to determine which portions of the received data have a higher importance. By determining variation between the initially received data and reconstructed data following decoding of the compressed data, masks and encoding processes generated by machine learning are able to be updated to continuously improve performance of the data compression system.

The below description focuses on light detection and ranging (LiDAR) sensors. However, one of ordinary skill in the art would understand that the data compression system is usable with other types of sensors, such as visible light sensors, infrared light sensors, radio detection and ranging (RADAR), sound navigation and ranging (SONAR) or other suitable sensor technology.

FIG. 1 is a schematic diagram of a data compression system 100 in accordance with some embodiments. The data compression system 100 is implemented using one or more processor, such as processor 702 (FIG. 7), described below. The data compression system 100 is configured to receive data 105 from at least one sensor. The data compression system 100 is further configured to receive additional information 110, e.g., from a user using an input/output (I/O) interface such as a graphical user interface (GUI). The additional information 110 and the data 105 are used to generate a mask 120, e.g., using a processor connected to an encoder 130. An encoder 130 receives both the mask 120 and the data 105. The mask 120 is applied to the data 105 at the encoder to determine what information and in what order the information is transmitted. The encoder 130 is configured to apply the mask to the data 105 to generate compressed data 137. The compressed data 137 is then transmitted, e.g., by a transmitter, using a network 135 from the encoder 130 to a decoder 140. The decoder 140 reconstructs the compressed data 137, e.g., using a processor connected to the decoder 140, in order to generate reconstructed data 150. The reconstructed data 150 is usable by the autonomously driving vehicle or the remote monitor in order to determine whether to adjust control of the vehicle or another remotely monitored object. In addition, the reconstructed data 150, in combination with the data 105 and the mask 120, are received by a loss calculator 160 used to determine a loss 165, e.g., using a processor connected to the encoder 130 or the decoder 140, between the originally received data 105 and the reconstructed data 150. By determining the loss 165, the mask 120 as well as the encoder 130 and the decoder 140 are able to be trained to improve performance of the data compression system 100.

In addition, the data compression system 100 is able to generate a ground truth (GT) mask 170, e.g., using a processor connected to the encoder 130 or the decoder 140, based on received GT segments 175 and additional information 177, e.g., from the user. The GT mask 170 is usable to train the mask 120. The GT mask 170 is free of errors in object detection results because known data is used to generate the GT mask 170. The GT segments 175 are known object segments in the data used for developing the GT mask 170. The additional information 177 are rules applied, e.g., using a processor connected to the encoder 130 or the decoder 140, to the GT segments 175 to generate the GT mask 170. In some embodiments, the additional information 177 is the same as the additional information 110. In some embodiments, the additional information 177 is different from the additional information 110. The result of the GT mask 170 are usable by the loss calculator 160, implement, e.g., using a processor connected to the encoder 130 or the decoder 140, to more accurately determine the loss 165. In some embodiments, the GT mask 170 is omitted. Omitting the GT mask 170 reduces a processing load on the data compression system 100.

In addition, an object detector 180 of the data compression system 100 is able to use the reconstructed data 150 to detect objects within the reconstructed data 150. The output of the object detector 180 is usable by the loss calculator 160 to compute an additional object detection loss to further improve accuracy of the data compression system 100. In some embodiments, the object detector 180 is omitted. Omitting the object detector 180 reduces a processing load on the data compression system 100. However, omitting the object detector 180 increases a risk of reducing the accuracy of the training of the mask 120.

The data 105 includes either a three-dimensional (3D) or a two-dimensional (2D) representation of an area detectable by the at least one sensor. In some embodiments, the at least one sensor is mounted on a vehicle. In some embodiments, the at least one sensor is mounted on a different vehicle. In some embodiments, the at least one sensor is mounted on a fixed object, such as a traffic signal or road sign. In some embodiments, data 105 is received from multiple sensors. In some embodiments, all of the sensor include a same type of sensor, e.g., LiDAR. In some embodiments, at least one of the sensors is a different type of sensor from at least one other sensor, e.g., LiDAR and visible light sensors. In some embodiments, the data 105 include a point cloud.

The additional information 110 includes rules for determining how the mask 120 is generated. In some embodiments, the additional information 110 is received from a user. In some embodiments, the data compression system 100 is configured to alert a user in response to the loss 165 being higher than a predetermined threshold. The loss is computed during the training of the data compression system 100. Once the data compression system is fully trained, loss computation is omitted. In some embodiments, the alert to the user includes an audio alert, a text alert, or another suitable alert. In some embodiment, the alert is transmitted to a mobile terminal accessible by the user. In some embodiments, the user is able to request updates to the training of the data compression system 100.

In some embodiments, the additional information 110 includes a rule based on distance of an object from the sensor. Applying one or more thresholds to the LiDAR, for example, data is able to help determine importance levels for different pixels within the received data without performing object detection first. The following description is provided as an example. One of ordinary skill in the art would understand that additional implementations and rules are within the scope of this disclosure. A first portion of the data 105 including a first object detected by the sensor to be within a first threshold distance from the sensor is designated a first importance value, e.g., a 1.0 value. A second portion of the data 105 including a second object detected by the sensor to be from the first threshold distance to a second threshold distance from the sensor is designated a second importance value, e.g., a 0.5 value. A third portion of the data 105 including a third object detected by the sensor to be more than the second threshold distance from the sensor is designated a third importance value, e.g., a 0 value. Each portion of the data 105 is analyzed to determine whether a proximity between the sensor and any detected objects in the corresponding region. The detection of an object by the sensor does not necessarily include classification of the object or determination of the type of object, but only determination of the existence of the object within a detected proximity of the sensor. For example, in some embodiments, LiDAR data will provide a distance for each pixel of data from the sensor. Applying one or more thresholds to the LiDAR data is able to determine importance levels for different pixels within the received data.

In some embodiments, the first distance threshold and the second distance threshold are determined by the user. In some embodiments, the first distance threshold and the second distance threshold are determined by or recommended by the data compression system 100. In some embodiments, the first distance threshold and/or the second distance threshold is a fixed value. In some embodiments, the first distance threshold and/or the second distance threshold varies based on various parameters known to the data compression system 100. For example, in some embodiments, the first distance threshold and/or the second distance threshold increases as a speed of a vehicle increases. In some embodiments, the first distance threshold and/or the second distance threshold decreases as a detectable range of the sensor decreases. For example, in inclement weather or as the sensor becomes dirty, the first distance threshold and/or the second distance threshold is increased to avoid further loss from data that has a significant noise component in the data. In some embodiments, the first distance threshold and/or the second distance threshold is adjusted based on a detected path of the road. For example, the first distance threshold and/or the second distance threshold is smaller for a road having curves than a straight road. In some embodiments, the path of the road is determined based on a map and data from a global positioning system (GPS) stored in the data compression system 100. In some embodiments, more than two distance thresholds are used. As a number of distance thresholds increases, accuracy and precision of the mask 120 is increased; however, processing load on the data compression system increases. In some embodiments, the first distance threshold is approximately equal to 200 meters (m). In some embodiments, the first distance threshold ranges from about 100 m to about 500 m. If the first distance threshold is too large, then a risk of the reconstructed data 150 being inaccurate decreases, in some instances. If the first distance threshold is too small, then a processing load on the data compression system 100 increases too much, in some instance. In some embodiments, the second distance threshold is approximately equal to 500 m. In some embodiments, the second distance threshold ranges from about 300 m to about 750 m. If the second distance threshold is too large, then a processing load on the data compression system 100 increases too much, in some instances. If the second distance threshold is too small, then a risk of the reconstructed data 150 being inaccurate increases, in some instance.

In some embodiments, the additional information 110 includes a rule based on a classification of object detected by the sensor. The following description is provided as an example. One of ordinary skill in the art would understand that additional implementations and rules are within the scope of this disclosure. A classification of an object would determine what type of object is detected. For example, an automobile, a bicycle, a pedestrian, a building, etc. Based on the determined type of object an importance value is assigned to the detected object. A first object category determined based on the data 105 is designated a first importance value, e.g., a 1.0 value. A second object classification determined based on the data 105 is designated a second importance value, e.g., a 0.6 value. A third object classification determined based on the data 105 is designated a third importance value, e.g., a 0.4 value. A fourth object classification determined based on the data 105 is designated a fourth importance value, e.g., a 0 value. Each portion of the data 105 is analyzed to determine whether an object of any of the classifications is within the corresponding region. In some embodiments, the types of object in each of the object classifications is determined by the user. In some embodiments, the types of object in each of the object classifications is automatically determined based on a location of the object relative to a road. For example, GPS information is usable to determine relative position between a detected object and the road. In some embodiments, the types of objects in each of the object classifications is automatically determined based on a detected size of the object. In some embodiments, the types of objects in each of the object classifications is automatically determined based on predicted movable speed of a detected object. For example, a detected vehicle would be predicted to have a higher movable speed than a person or a bicycle. In some embodiments, different combinations of parameters are used to automatically classify detected objects.

In some embodiments, the first object category includes vehicles, pedestrians and/or bicycles. In some embodiments, the second object classification includes the road, a sidewalk and/or a road sign. In some embodiments, the third object classification includes buildings, trees, fences, power line poles and/or telephone poles. In some embodiments, the fourth object classification includes the sky and/or flying objects.

In some embodiments, the additional information 110 includes a rule based on a detected velocity of a detected object. The following description is provided as an example. One of ordinary skill in the art would understand that additional implementations and rules are within the scope of this disclosure. Using data 105 collected at different times, the data compression system 100 is able to determine a change in a position of a detected object relative to the sensor. Based on the determined change in position, the data compression system 100 is able to determine a velocity of the detected object relative to the sensor. The velocity includes both a speed and a direction of movement of the detected object. A first object determined to be moving toward the sensor at a high speed based on the data 105 is designated a first importance value, e.g., a 1.0 value. A second object determined to be moving toward the sensor at a low speed based on the data 105 is designated a second importance value, e.g., a 0.6 value. A third object determined to be moving away from the sensor at a low speed based on the data 105 is designated a third importance value, e.g., a 0.4 value. A fourth object determined to be moving away from the sensor at a high speed based on the data 105 is designated a fourth importance value, e.g., a 0 value. Each portion of the data 105 is analyzed to determine whether an object of any of the classifications is within the corresponding region. A speed threshold is usable to determine whether the detected object is moving at a high speed or a low speed. Detected objects determined to have a speed at or above the speed threshold are determined to have a high speed; and detected objects determined to have a speed below the speed threshold are determined to have a low speed. In some embodiments, the speed threshold is set by the user. In some embodiments, the speed threshold is set or recommended by the data compression system 100. In some embodiments, the speed threshold is a fixed value. In some embodiments, the speed threshold is adjustable. In some embodiments, the speed threshold is adjusted based on a speed of a vehicle including the system, detected road conditions, detected visibility conditions or other suitable parameters. In some embodiments, the speed threshold is approximately equal to 60 kilometers per hour (km/h). In some embodiments, the speed threshold ranges from about 20 km/h to about 100 km/h. If the speed threshold is too large a risk of inaccuracy in the mask 120 increases, in some instances. If the speed threshold is too small a processing load on the data compression system 100 increases without noticeable improvement in performance, in some instances.

One of ordinary skill in the art would recognize that combinations of the above described specific examples for rules are combinable in different combinations in some embodiments. For example, in some embodiments, a combination of object distance and classification are used to designate the importance value of the detected object. One of ordinary skill in the art would also recognize that additional or few levels of importance values are usable in some embodiments. As a number of importance value levels increases, a processing load on the data compression system 100 increases, in some instances. As a number of importance value levels decreases, a risk of inaccuracy in the reconstructed data 150 increases, in some instances.

The mask 120 is generated based on the data 105 and the additional information 110. Generating the mask 120 includes applying the rules of the additional information 110 to the data 105 from the sensor. The data 105 is separated into regions including one or more pixels. Each of the regions of the data 105 is assigned an importance value based on the additional information 110. As a number of regions of the data 105 increases the processing load on the data compression system 100 increases. However, as a number of regions of the data 105 increases, accuracy of the reconstruction data 150 improves. In some embodiments, a number of regions of the data 105 is predetermined. In some embodiments, the number of regions of the data 105 varies based on different parameters. For example, in some embodiments, the number of regions 105 decreases as a speed of a vehicle on which the sensor is mounted increases. This reduces the processing load on the data compression system 100 and reduces lag time between collection of the data 105 and outputting of the reconstructed data 150.

The encoder 130 extracts features from the data 105 based on the mask 120. In some embodiments, portions of the data 105 corresponding to higher importance values in the mask 120 are extracted before portions of the data 105 having lower importance values. In some embodiments, portions of the data 105 having higher importance values are extracted at a higher resolution than portions of the data 105 having lower importance values. In some embodiments, a combination of priority extraction and higher resolution is utilized by the encoder 130. In some embodiments, the encoder 130 includes a residual network, e.g., ResNet-50, or a fully convolutional residual network. In some embodiments, the encoder 130 includes dilated convolutional layers or strided convolutional layers. The encoder 130 generates the compressed data 137 to be transmitted by the network 135. In some embodiments, the portions of the compressed data 137 corresponding to the data 105 having the higher importance values are transmitted prior to transmission of portions of the compressed data 137 corresponding to the data 105 having lower importance values.

In some embodiments, a transmitter or a transceiver is utilized by the data compression system 100 to transmit the compressed data 137 over the network 135. In some embodiments, the network 135 is a wireless network. In some embodiments, the network 135 is a wired network. In some embodiments, the compressed data 137 is transmitted to multiple locations, e.g., to the decoder 140 within the vehicle as well as to a remote monitor.

The decoder 140 reconstructs the compressed data 137 received from the network 135 to form the reconstructed data 150. In some embodiments, a receiver or transceiver is utilized by the data compression system 100 to receive the compressed data 137 from the network 135. In some embodiments, the decoder 140 includes a residual network, e.g., ResNet-50, or a fully convolutional residual network. In some embodiments, the decoder 140 includes dilated convolutional layers or strided convolutional layers.

The reconstructed data 150 is based on the data 105 and is usable by an autonomous driving system (not shown) or a remote monitor (not shown). In some embodiments, portions of the data 105, e.g., portions having a low importance value, are missing from the reconstructed data 150. In some embodiments, portions of the reconstructed data 150, e.g., portions having a low importance value, have a lower resolution than other portions of the reconstructed data 150, e.g., portions having a higher importance value. In some embodiments, the reconstructed data 150 is provided as an image viewable by a remote monitor. In some embodiments, the reconstructed data 150 includes information readable by a processor, e.g., for autonomous driving or remote monitoring.

The data compression system 100 reduces processing load for generation of the reconstructed data 150 in comparison with other approaches. By reducing resolution or excluding portions of the data 105 in the generation of the reconstructed data 150, the processing load on the receiving side is reduced without a significant loss of relevant information of the reconstructed data 150. The reduced processing load while maintaining relevant information means that an autonomous driving system is able to be more quickly and accurately identify hazards.

The loss calculator 160 compares the reconstructed data 150 with detected data while also using the mask 120 to determine whether the data 105 was accurately encoded, transmitted, and decoded. In some embodiments, the loss calculator 160 determines the loss 165 based on an importance based mean square error loss algorithm. For example, in some embodiments, the loss 165 is determined using the following Equation (1):

$$\text{Loss} = \Sigma(x_i - y_i)^2 M_i \qquad \text{Equation (1)}$$

where $x_i$ is the original data 105 for a pixel or group of pixels, $y_i$ is the reconstructed data 150 for the pixel or group of pixels, and $M_i$ is the importance designated to the pixel or group of pixels.

The loss 165 is fed back into the data compression system 100 in order to train the encoder 130 and the decoder 140 to improve accuracy of the reconstructed data 150. In some embodiments, the loss 165 is used to improve generation of the mask 120, as described below.

The GT mask 170 is generated based on known information provided by the GT segments 175 and additional information 177. The GT mask 170 is generated in a manner similar to the generation of the mask 120. In some embodiments, the additional information 177 matches the additional information 110. In some embodiments, a number of regions of the data 105 used in generating the mask 120 is equal to a number of regions applied to the GT segments 175 for the generation of the GT mask 170. In some embodiments, the data 105 is used in the generation of the GT mask 170 in order to apply known information, such as object classification, to the data 105 during generation of the GT mask 170. The GT mask 170 is supplied to the loss calculator 160 to determine the loss 165.

In some embodiments where the loss calculator 160 receives the GT mask 170, the loss calculator 160 determines the loss 165 based on a combination of mask loss and an importance based mean square error loss algorithm. For example, in some embodiments, the loss 165 is determined using the following Equation (2):

$$\text{Loss} = \Sigma(x_i - y_i)^2 M_i + (M_{GT} - M)^2 \qquad \text{Equation (2)}$$

where $x_i$ is the original data 105 for a pixel or group of pixels, $y_i$ is the reconstructed data 150 for the pixel or group of pixels, $M_i$ is the importance designated to the pixel or group of pixels, $M_{GT}$ is the GT mask 170, and M is the mask 120. M and $M_{GT}$ are matrices. In some embodiments, an average of the differences is used in place of merely a sum total of the differences. In order to combine the matrices, an average over all elements of each of the matrices is used.

The object detector 180 is configured to detect objects based on the reconstructed data 150. In some embodiments, the object detector 180 classifies detected objects from the reconstructed data 150. In some embodiments, the object detector 180 modifies the reconstructed data 150 viewable by a remote monitor in order to highlight detected objects. For example, in some embodiments, a box or other distinguishing system is placed around or adjacent to a detected object to draw the attention of the remote monitor. In some embodiments, the highlighting is performed based on a classification of the detected object. For example, in some embodiments, vehicles are highlighted while trees are not highlighted. Detecting objects also helps an autonomous driving system to more precisely control a vehicle and avoid potential collisions with other objects.

In some embodiments where the loss calculator 160 receives the results of the object detector 160, the loss calculator 160 determines the loss 165 based on a combination of object loss and an importance based mean square error loss algorithm. The object loss is a sum of an average of classification loss and regression loss for each detected object. Each of classification loss and regression loss is cross-entropy loss. In some approaches, classification loss in object detection is determined using the following Equation (3):

$$Loss_{class} = (1/N) \Sigma (loss_{class})_i \qquad \text{Equation (3)}$$

where N is the number of objects detected, and $loss_{classi}$ is a classification loss for detected object. In Equation (3), the importance of the object is not considered. In some embodiments, the classification loss is determined using the following Equation (4):

$$Loss_{class} = (1/N) \Sigma (loss_{class})_i M_i \qquad \text{Equation (4)}$$

where N is the number of objects detected, $loss_{classi}$ is a classification loss for detected object, and $M_i$ is an importance of the detected object. Equation (4) includes the importance of the detected object. As a result, important objects have a more significant impact in the overall classification loss calculation.

In some approaches, the regression loss is determined using the following Equation (5):

$$Loss_{reg} = (1/N) \Sigma (loss_{reg})_i \qquad \text{Equation (5)}$$

where N is the number of objects detected, and $loss_{regi}$ is a regression loss for detected object. In Equation (5), the importance of the object is not considered. In some embodiments, the regression loss is determined using the following Equation (6):

$$Loss_{reg} = (1/N) \Sigma (loss_{reg})_i M_i \qquad \text{Equation (6)}$$

where N is the number of objects detected, $loss_{regi}$ is a regression loss for detected object, and $M_i$ is an importance of the detected object. Equation (6) includes the importance of the detected object. As a result, important objects have a more significant impact in the overall regression loss calculation.

In some embodiments, the importance of the objected detected, $M_i$ is calculated by determining a group of pixels of the reconstructed data 150 that include the corresponding detected object. An importance determination is performed for each pixel with the group of pixels. In some embodiments, the importance determination is similar to the importance determination described above with respect to additional information 110. The importance determination is then averaged over the entire group of pixels, i.e., the importance values for each pixel is added together and then divided by the number of pixels in the group of pixels.

In some embodiments, the loss 165 is determined using the following Equation (7):

$$Loss = loss_{IMSE} + loss_{class} + loss_{reg} \qquad \text{Equation (7)}$$

where $loss_{IMSE}$ is the mean square error loss, $loss_{class}$ is the classification loss, and $loss_{reg}$ is the regression loss.

Figure 2:
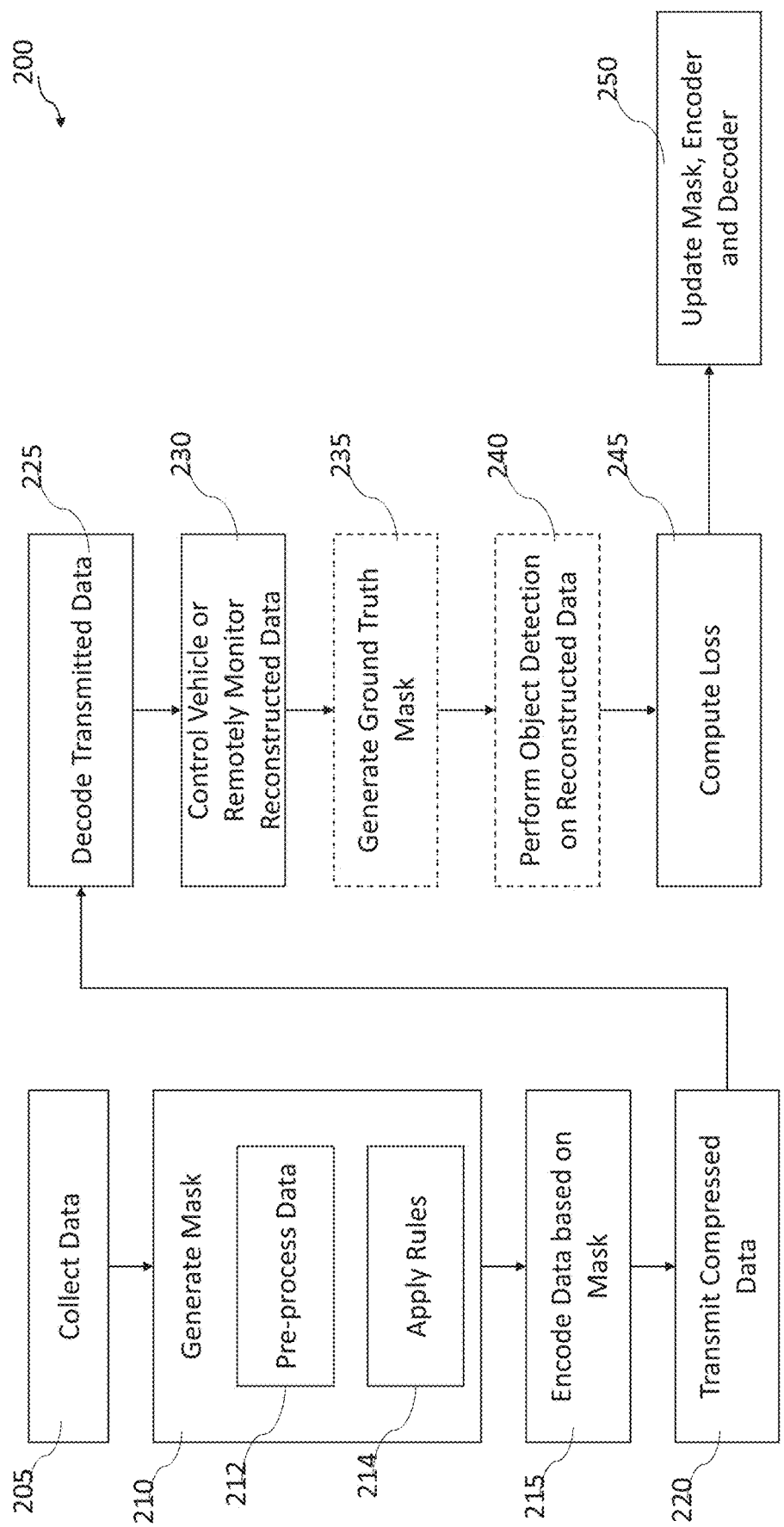
FIG. 2 is a flowchart of method of compressing data in accordance with some embodiments.

FIG. 2 is a flowchart of a method 200 of compressing data in accordance with some embodiments. In some embodiments, the method 200 is executable by the data compression system 100. In operation 205, data is collected. In some embodiments, the data is collected from a single sensor. In some embodiments, the data is collected from a plurality of sensors. In some embodiments, each of the sensors is a same type of sensor. In some embodiments, at least one sensor is different from at least one other sensor. In some embodiments, the sensor includes at least one of LiDAR, visible light sensor, IR light sensor, RADAR, SONAR, or another suitable type of sensor. In some embodiments, the data collected in operation 205 corresponds to the data 105 (FIG. 1).

In operation 210, a mask is generated, e.g., using a processor connected to the encoder 130 (FIG. 1). The mask is generated by pre-processing, in operation 212, the data collected in operation 205; and applying rules, in operation 214, to the pre-processed data. In some embodiments, rules applied are based on the additional information 110 (FIG. 1). In some embodiments, the pre-processing includes classification of detected objects. In some embodiments, the pre-processing includes determination of a velocity of each detected object. In some embodiments, the pre-processing includes determining a distance of each detected object from the corresponding sensor. In some embodiments, the pre-processing is omitted. For example, in some embodiments where the sensor includes LiDAR, a distance between the sensor and each detected object is already determined, so pre-processing to determine a distance between the sensor and the detected objects is unnecessary. One of ordinary skill in the art would understand that pre-processing to determine object classification is performed even when the sensor is LiDAR in some embodiments. In some embodiments, operation 210 produces the mask 120 (FIG. 1).

In operation 215, the data is encoded by an encoder, e.g., the encoder 130 (FIG. 1), based on the mask generated in operation 210. In some embodiments, encoding the data includes reducing a resolution of portions of the data having a low importance value. Encoding the data produces compressed data, e.g., compressed data 137 (FIG. 1).

In operation 220, the compressed data is transmitted, e.g., using a transmitter. In some embodiments, the compressed data is transmitted via a wireless network. In some embodiments, the compressed data is transmitted using a wired network. In some embodiments, the network includes network 135 (FIG. 1).

In operation 225, the transmitted data is decoded by a decoder, e.g., the decoder 140 (FIG. 1). Decoding the transmitted data produces reconstructed data, e.g., reconstructed data 150 (FIG. 1). The reconstructed data is different from the data collected in operation 205. In some embodiments, portions of the reconstructed data have lower resolution in comparison with corresponding portions of the data collected in operation 205.

In operation 230, a vehicle is controlled, e.g., using a processor connected to the encoder 130 or the decoder 140 (FIG. 1), based on the reconstructed data or the reconstructed data is remotely monitored. In some embodiments where a vehicle includes an autonomous driving system, the reconstructed data is used to control the vehicle to avoid detected objects. In some embodiments where remote monitoring is performed, the reconstructed data is provided to a remote monitor.

The data compression method 200 reduces a lag time between collection of the data in operation 205 and generation of the reconstructed data in operation 225 in comparison with other approaches. By reducing resolution or excluding portions of the data collected in operation 205 in the generation of the reconstructed data in operation 225, the lag time is reduced without a significant loss of relevant information of the reconstructed data. The reduced lag time while maintain relevant information means that an autonomous driving system is able to be more responsive to detected objects and/or that a remote monitor is able to more quickly and accurately identify hazards.

In optional operation 235, a ground truth mask is generated, e.g., using a processor connected to the encoder 130 (FIG. 1). The ground truth mask is generated based on known data in order to help improve the generation of the mask in operation 210 as part of a feedback process. In some embodiments, the ground truth mask corresponds to the GT mask 170 (FIG. 1). In some embodiments, the operation 235 is omitted when the mask is generated based on rules instead of machine learning. The operation 235 is omitted in order to reduce processing load in some embodiments.

In optional operation 240, object detection is performed on the reconstructed data. In some embodiments, the object detection is performed using the object detector 180 (FIG. 1). The object detection identifies objects in the reconstructed data. In some embodiments, the object detection modifies the reconstructed data viewable by a remote monitor in order to highlight detected objects. For example, in some embodiments, a box or other distinguishing system is placed around or adjacent to a detected object to draw the attention of the remote monitor. In some embodiments, the highlighting is performed based on a classification of the detected object. For example, in some embodiments, vehicles are highlighted while trees are not highlighted. Detecting objects also helps an autonomous driving system to more precisely control a vehicle and avoid potential collisions with other objects. In some embodiments, the operation 240 is omitted. The operation 240 is omitted in order to reduce processing load in some embodiments.

In operation 245 a loss is computed, e.g., using a processor connected to the encoder 130 or the decoder 140 (FIG. 1), based on a combination of regression loss, classification loss and mean square error loss. In some embodiments, the loss is computed using importance based means square error loss. In some embodiments, the loss is computed based on the ground truth mask. In some embodiments, the loss is computed based on the objection detection performed on the reconstructed data. In some embodiments, the loss corresponds to the loss 165 (FIG. 1).

In operation 250, the mask, the encoder and the decoder are updated based on the loss computed in operation 245, e.g., using one or more processors connected to the encoder 130 and/or the decoder 140 (FIG. 1). In some embodiments, only the encoder and decoder are updated. The updating helps to improve the accuracy of the reconstructed data to improve reliability of an autonomous driving system or a remote monitoring system.

In some embodiments, an order of operations in method 200 is adjusted. For example, in some embodiments, the ground truth mask in operation 235 is generated, e.g., using a processor connected to the encoder 130 (FIG. 1), prior to the encoding of the data in operation 215. In some embodiments, additional operations are included in the method 200. For example, in some embodiments, alerts are generated to be sent to a remote monitor. In some embodiments, the alerts include audio alerts, text alerts or another suitable alert. In some embodiments, the alerts are transmitted to a mobile terminal of the remote monitor. In some embodiments, an operation of the method 200 is removed. For example, in some embodiments, operation 212 is omitted where pre-processing of the data collected in operation 205 is unnecessary.

Figure 3A:
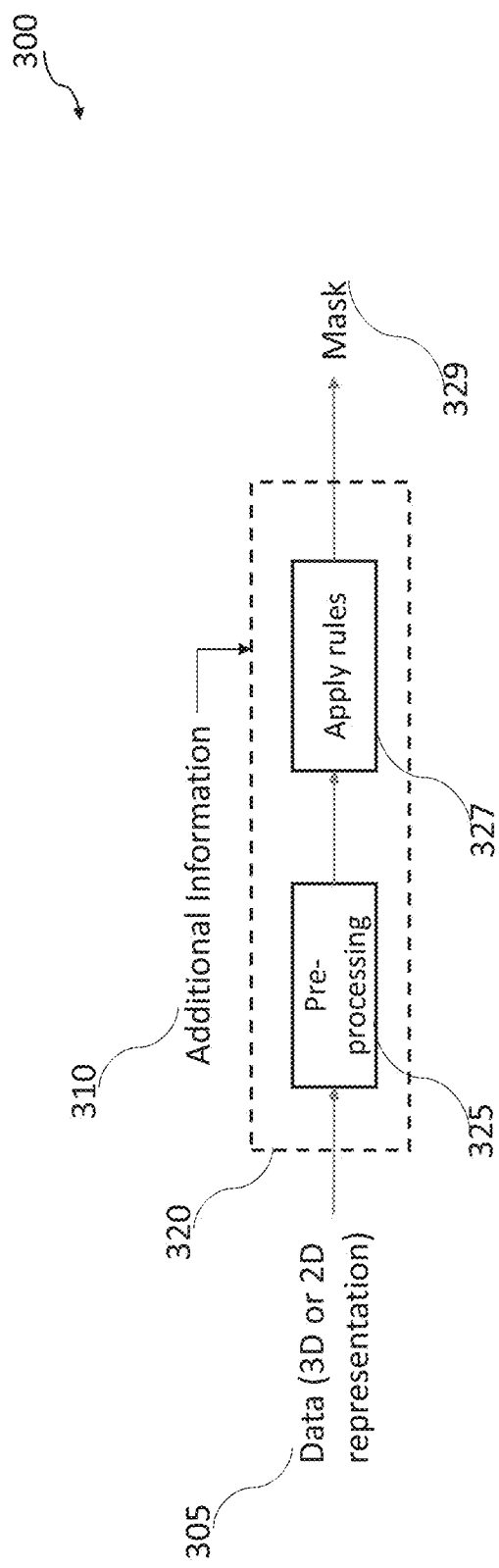
FIG. 3A is a flowchart of a method of generating a mask in accordance with some embodiments.

FIG. 3A is a flowchart of a method 300 of generating a mask in accordance with some embodiments. In some embodiments, the method 300 is usable to implement the operation 210 of the method 200 (FIG. 2). In some embodiments, the method 300 is usable to generate the mask 120 (FIG. 1). Data 305 is received from a sensor. In some embodiments, the data 305 is similar to the data 105 (FIG. 1).

In operation 320 a mask is generated, e.g., using a processor connected to the encoder 130 (FIG. 1). In operation 325 pre-processing is performed on the data 305, e.g., using a processor connected to the encoder 130 (FIG. 1). The additional information is provided to operation 320 to be usable by both operation 325 and operation 327. In some embodiments, the pre-processing is performed without relying on the additional information 310, in some embodiments. In some embodiments, the pre-processing is performed in consideration of the additional information in order to reduce processing load. In some embodiments, the additional information is similar to the additional information 110 (FIG. 1). In some embodiments, the pre-processing includes classification of detected objects, determination of a velocity of each detected object, determining a distance of each detected object from the corresponding sensor or another suitable pre-processing operation.

In operation 327, rules from the additional information 310 are applied to the pre-processed data in order to generate a mask 329. In some embodiments, the mask 329 is similar to the mask 120 (FIG. 1). In some embodiments, the rules include rules related to a velocity of detected objects, rules related to distances of the objects from the corresponding sensor, rules related to classifications of object, or combinations of rules.

Figure 3B:
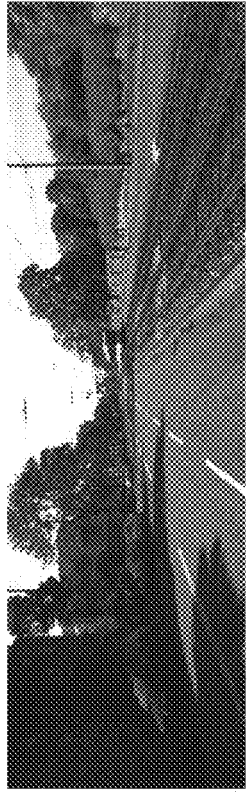
FIG. 3B is an image received by a sensor in accordance with some embodiments.

FIG. 3B is an image 330 received by a sensor in accordance with some embodiments. In some embodiments, the image 330 is captured by a visible light sensor or an infrared light sensor. In some embodiments, the image 330 is usable as the data 105 (FIG. 1), the data 305 (FIG. 3A) or the data collected in operation 205 (FIG. 2).

Figure 3C:
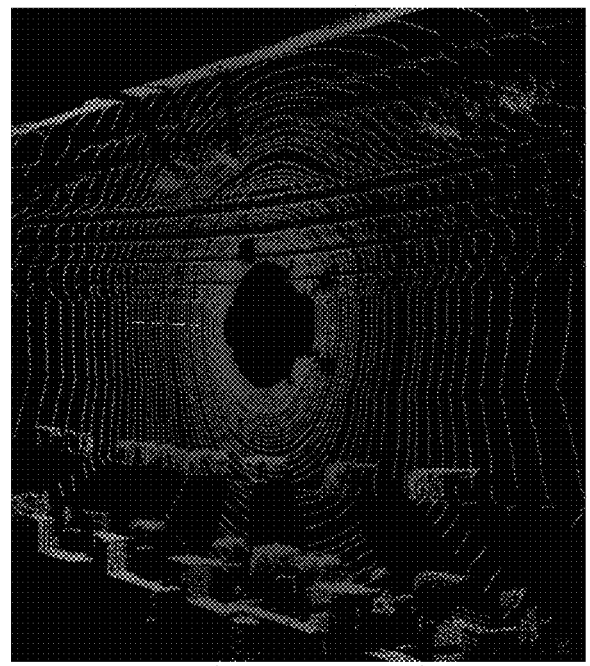
FIG. 3C is a point cloud received by a sensor in accordance with some embodiments.

FIG. 3C is a point cloud 340 received by a sensor in accordance with some embodiments. In some embodiments, the point cloud 340 is captured by LiDAR. In some embodiments, the point cloud 340 is usable as the data 105 (FIG. 1), the data 305 (FIG. 3A) or the data collected in operation 205 (FIG. 2). The point cloud 340 is captured at a same view as the image 330 (FIG. 3B). In comparison with the image 330, the point cloud 340 includes dots indicating locations where light from the LiDAR sensor was reflected back toward the sensor. The 3D rendering of the point cloud 340 indicates the ability of LiDAR to determine distance of objects from the sensor. In some embodiments, the point cloud 340 is converted into a two-dimensional (2D) representation, e.g., a range image or a bird's eye view image.

Figure 3D:
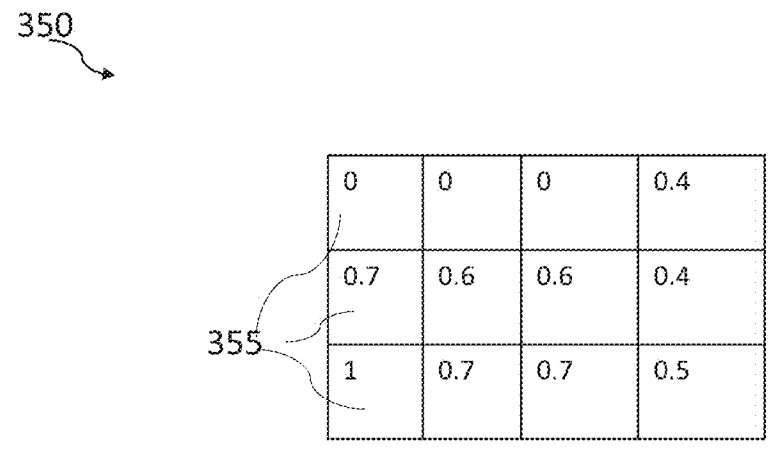

FIG. 3D is a mask 350 applicable to sensor data in accordance with some embodiments. The mask 350 includes a plurality of regions 355. Each of the regions 355 indicates a group of pixels of the data used to generate the mask 350. Mask 350 is generated based on a same view as the image 330 (FIG. 3B) and the point cloud 340 (FIG. 3C). The mask 350 also includes importance values in each of the regions 355. The importance values for the regions 355 are generated based on a combination of rules such as object distance and object classification.

Overlaying the image 330 (FIG. 3B) with the mask, we can see that along a right-hand side of the image are train tracks. Train tracks have a low likelihood of impeding a vehicle along a road. Therefore, the importance values along the right-hand side of the mask indicate low importance. The value of the lower right-hand region 355 is higher than the other right-hand side regions 355 because of the proximity between the lower right-hand region and the sensor. The importance values at the top of the mask 350 correspond to the sky in the image 330. The sky has a very low importance value to control of the vehicle during autonomous driving or to a remote monitor. In a path in front of the sensor is a road. The road has a higher importance that the train tracks, but since there are no vehicles on the road in front of the sensor the importance value is less than a maximum value. Again, the importance value decreases along the road as a distance from the sensor increases. Along the left-hand side of the mask 350 the regions 355 have higher importance values. As seen in the image 330, vehicles are parked along the side of the road. These vehicles have a higher collision risk than any other object in the image. Therefore, the regions 355 including these vehicles have a higher importance. Again, the regions 355 closer to the sensor have higher importance that regions 355 farther from the sensor including similar objects. In some embodiments, point cloud data within a minimum threshold distance of the sensor is given a lower importance value because few objects would be expected to be located within such a close distance. In some embodiments, the minimum threshold distance is less than 100 m. In some embodiments, the minimum threshold distance is less than 50 m. In some embodiments, the minimum threshold distance is less than 10 m.

Figure 4:
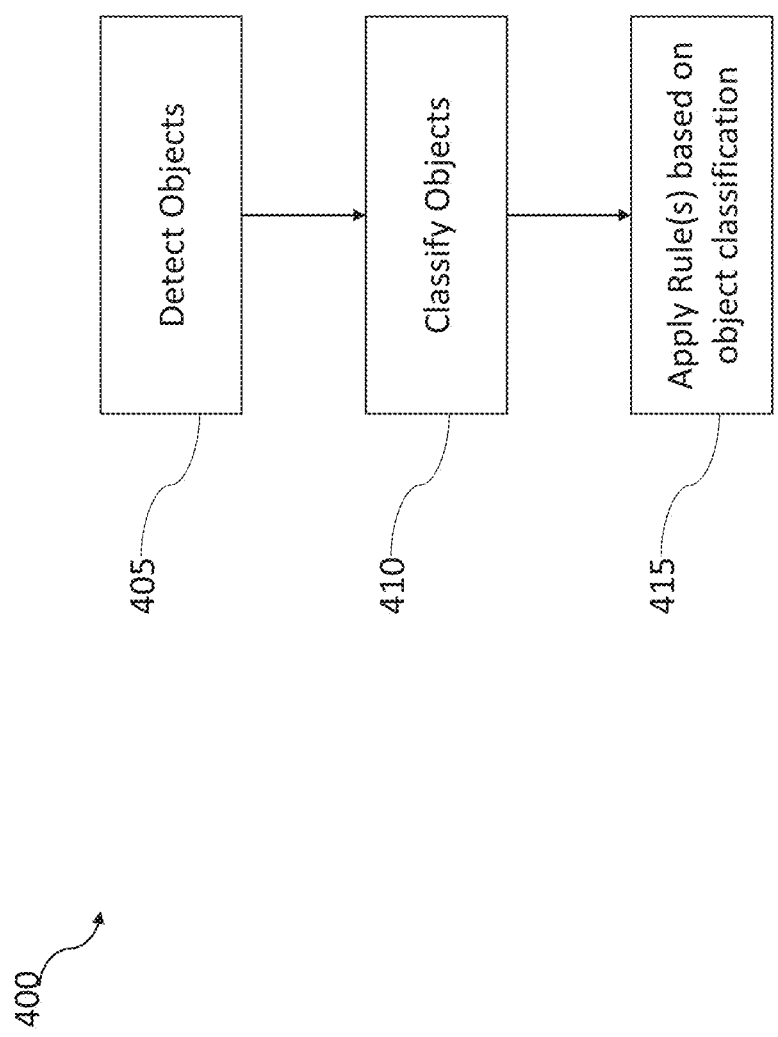
FIG. 4 is a flowchart of a method of applying rules to received data in accordance with some embodiments.

FIG. 4 is a flowchart of a method 400 of applying rules to received data in accordance with some embodiments. In some embodiments, the method 400 is usable to implement operation 327 (FIG. 3A). In some embodiments, the method 400 is usable to implement operation 314 (FIG. 2). In operation 405, objects are detected, e.g., using the object detector 180 (FIG. 1). In some embodiments, the objects are detected based on a database of object images. In some embodiments, the objects are detected based on other parameters such as heat signatures, size, movement or other appropriate parameters.

In operation 410, the detected objects are classified, e.g., using the object detector 180 (FIG. 1). In some embodiments, classification of the detected objects is based on user input. In some embodiments, classification of the detected objects is based on a database. In some embodiments, classification of the objects is based on distance from the sensor.

In operation 415, one or more rules is applied to the detected objects based on the classification, e.g., using a processor connected to the encoder 130 or the decoder 140 (FIG. 1). The rules are applied in order to determine the importance of each of the detected objects. In some embodiments, the rules are similar to the additional information 110 (FIG. 1) discussed above. In some embodiments, the rules are applied based on proximity to the sensor, movement of the detected object, type of the detected object, or a combination of these. Following application of the rules to the detected objects, a mask is generated. In some embodiments, the mask generated is similar to the mask 120 (FIG. 1).

Figure 5:
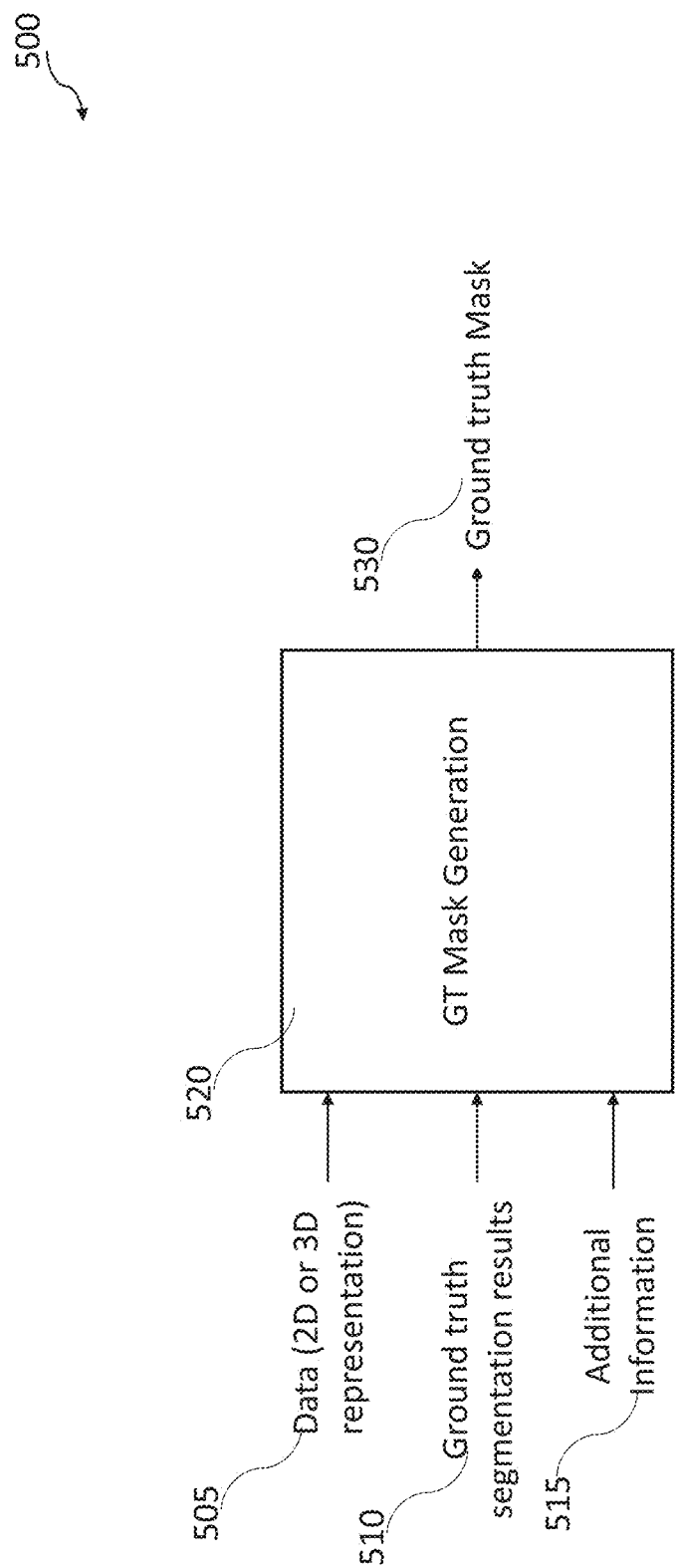
FIG. 5 is a flowchart of a method of generating a ground truth mask in accordance with some embodiments.

FIG. 5 is a flowchart of a method 500 of generating a ground truth mask in accordance with some embodiments. In some embodiments, the method 500 is usable to generate GT mask 170 (FIG. 1). The method 500 includes receiving data 505, GT segmentation rules 510 and additional information 515. In some embodiments, the GT segmentation rule 510 are similar to the GT segments 175 (FIG. 1). In some embodiments, the additional information 515 is similar to the additional information 177 (FIG. 1). In some embodiments, the data 505 is similar to the data 105 (FIG. 1). In operation 520, the GT mask is generated based on the data 505, the ground truth segments 510 and the additional information 515. In comparison with generating a mask, such as in method 300 (FIG. 3), the method 500 includes the ground truth segments 510, which are based on known information. By including known information along with data 505 and the additional information, the ground truth mask 530 produces a result based on detection results with no errors. As a result, the ground truth mask has a higher degree of reliability and is usable to train a mask, such as mask 120 (FIG. 1), during encoding of data. The operation 520 outputs the ground truth mask 530.

Figure 6:
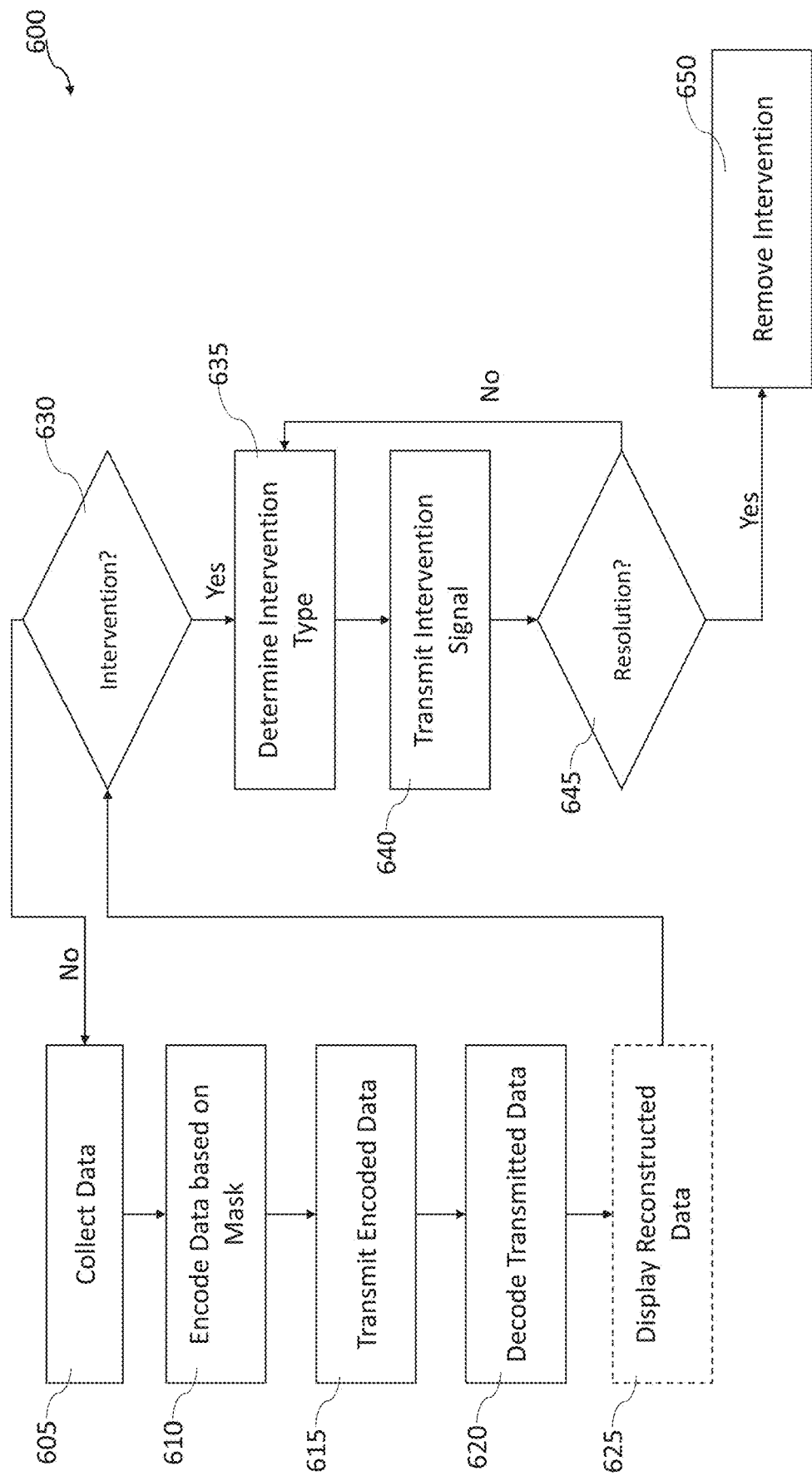
FIG. 6 is a flowchart of a method of using a data compression system in accordance with some embodiments.

FIG. 6 is a flowchart of a method 600 of using a data compression system in accordance with some embodiments. In some embodiments, at least portions of the method 600 are implemented using the data compression system 100 (FIG. 1). In some embodiments, the method 600 implements a remote monitoring aspect of the current disclosure. In remote monitoring, a remote monitor receives data and determines whether some type of intervention is recommended by the remote monitor. The remote monitor is able to continue monitoring the impacts of any intervention to determine whether to end or modify the intervention. In some embodiments, the remote monitor is a user. In some embodiments, the remote monitor is automated.

In operation 605, data is collected, e.g., using the sensor used to collect data 105 (FIG. 1). In some embodiments, the operation 605 is similar to the operation 205 (FIG. 2).

In operation 610, the data is encoded based on a mask, e.g., using a processor connected to the encoder 130 (FIG. 1). In some embodiments, the operation 610 is similar to a combination of operations 210 and 215 (FIG. 2).

In operation 615, the encoded data is transmitted, e.g., using a transmitter. In some embodiments, the operation 615 is similar to the operation 220 (FIG. 2).

In operation 620, the transmitted data is decoded, e.g., using the decoder 140 (FIG. 1). In some embodiments, the operation 620 is similar to the operation 225 (FIG. 2).

In optional operation 625, the reconstructed data is displayed, e.g., using a display such as a mobile terminal. The reconstructed data is obtained by the decoding of the transmitted data from operation 620. In some embodiments, portions of the reconstructed data have a lower resolution that portions of the data collected in operation 605. In some embodiments, the reconstructed data includes highlighting of detected objects. In some embodiments, the reconstructed data is free of highlighting of detected objects. In some embodiments, the reconstructed data includes a visible light image. In some embodiments, the reconstructed data includes a point cloud image. In some embodiments, the reconstructed data is displayed on numerous displays. In some embodiments, the reconstructed data is displayed in response to a selection of the reconstructed data by the remote monitor. That is, the reconstructed data is available for display, but remains non-displayed until a remote monitor selects the reconstructed data.

In some embodiments, the reconstructed data is displayed in response to an alert being generate, e.g., using a processor connected to the decoder 140 (FIG. 1). For example, in some embodiments, in response to a vehicle colliding with an object, an alert is generated and transmitted to the remote monitor. In some embodiments, the alert is an audio alert. In some embodiments, the alert is a text alert. In some embodiments, the alert is transmitted to a terminal, such as a mobile terminal, viewable by the remote monitor. In response to the alert, the remote user is able to select the reconstructed data. By including the alert, a risk of the remote monitor failing to identify a potential problem is reduced.

In some embodiments, the operation 625 is omitted. In some embodiments, the operation 625 is omitted in response to the remote monitor being automated. That is, the automated remote monitor has no need for a display of the reconstructed data.

In operation 630, a determination is made regarding whether intervention is recommended, e.g., by a user such as a remote viewer or using a processor connected to the decoder 140 (FIG. 1). Intervention is an action that the remote monitor is able to implement to help to alleviate problems identified by the reconstructed data. For example, in some embodiments where the reconstructed data indicates a collision by the vehicle, the remote monitor is able to send emergency assistance to a location of the vehicle. In some embodiments where the reconstructed data indicates heavy traffic, the remote monitor is able to provide recommended re-routing instructions to vehicles including manned and/or autonomous driving vehicles.

A determination is made regarding whether intervention is recommended based on whether any of the available intervention options at the location of collected data corresponding to the reconstructed data would improve a situation indicated by the reconstructed data. If an improvement is possible based on the available intervention options, then intervention is recommended. If no improvement is possible based on the available intervention options, then intervention is not recommended. One of ordinary skill in the art would note that not all intervention options are available at every location. For example, control of traffic signals is more likely to be an available option in a city rather than in a rural area.

In response to a determination that intervention is not recommended, the method returns to operation 605, as indicated by "No." In response to a determination that intervention is recommended, the method proceeds to operation 635, as indicated by "Yes."

In operation 635, a type of intervention is determined, e.g., by a user such as a remote viewer or using a processor connected to the decoder 140 (FIG. 1). The type of intervention is the intervention that the remote monitor will implement based on the reconstructed data. The type of intervention is determined based on the interventions options available at the location of the collected data from operation 605 corresponding to the reconstructed data. In some embodiments, intervention options are displayed to a remote monitor in response to a determination that intervention is recommended. In some embodiments, the intervention type is selected based on which type of intervention will have the greatest improvement to the situation indicated by the reconstructed data. In some embodiments, the intervention type is selected based on which type of intervention will have a fastest impact on the situation indicated by the reconstructed data. For example, in some embodiments where the reconstructed data indicates a collision, changing of traffic signals to route vehicles around the collision will have a faster impact than sending emergency assistance to the collision location. In some embodiments, an intervention type is recommended based on computer analysis of the reconstructed data.

In operation 640, the intervention signal is transmitted, e.g., by a transmitter. In some embodiments, the intervention signal is transmitted via a wireless network. In some embodiments, the intervention signal is transmitted via a wired network. In some embodiments, the network on which the intervention signal is transmitted is a same network in which the encoded data is transmitted. In some embodiments, the network on which the intervention signal is transmitted on a different network from the network on which the encoded data is transmitted. In some embodiments, the destination of the transmitted intervention signal is based on the type of intervention determined in operation 635. For example, in some embodiments where the invention type is to send emergency assistance, the intervention signal is transmitted to police or other emergency responders. In some embodiments where the invention type is to adjust traffic signals, the intervention signal is transmitted to traffic signals near the location of the collected data corresponding to the reconstructed data.

In some embodiments, a notification signal is transmitted to the vehicle indicating a type of intervention selected. In some embodiments, the notification signal also includes an estimated time of arrival for the selected intervention.

In operation 645, a determination is made regarding whether the situation indicated by the reconstructed data is resolved, e.g., by a user such as a remote viewer or using a processor connected to the decoder 140 (FIG. 1). In order to make the determination, the remote monitor will continue to monitor the reconstructed data over time. If the situation has returned to an expected situation, then a determination is made that the situation has been resolved. In response to a determination that the situation has not been resolved, the method 600 returns to operation 635 and the remote monitor determines whether an additional or different type of intervention should be implemented, as indicated by "No." In response to a determination that the situation has been resolved, the method 600 proceeds to operation 650, as indicated by "Yes."

In operation 650, the intervention implemented by the signal transmitted in operation 640 is removed, e.g., by a user such as a remote viewer or using a processor connected to the decoder 140 (FIG. 1). In some embodiments, removal of the intervention includes transmitting a signal to return operations to a normal setting. In some embodiments, removal of the intervention includes transmitting a signal indicating that no further emergency assistance is requested. In some embodiments, a notification signal is transmitted to the vehicle indicating that the intervention is ended. In some embodiments, the notification signal includes a request for confirmation that no further intervention is requested by an operator or passenger in the vehicle. In response to a request for additional intervention, the method 600 returns to operation 630.

Using the method 600, which includes the use of a mask for encoding collected data, lag time between occurrence of an event and implementation of intervention from a remote monitor is reduced without sacrificing accuracy in the remote monitor ability to identify the occurrence of the event. By reducing the amount of data transmitted due to the use of the mask, the processing load and lag time are reduced and faster response times for intervention are possible. This helps a driver or passenger of the vehicle including the sensor that collects the data as well as drivers and passengers of other vehicles which can be routed around events which may cause traffic or danger to the drivers and passenger.

In some embodiments, operations of the method 600 are performed in a different order. For example, in some embodiments, the operation 635 is performed prior to operation 630 so that a determination of whether intervention is recommended is based on the types of intervention selectable by the remote monitor. In some embodiments, at least one operation of the method 600 is omitted. For example, in some embodiments, the operation 625 is omitted when the remote monitor is automated. In some embodiments, additional operations are included in the method 600. For example, in some embodiments, notification signals are transmitted to the vehicle including the sensor that collects the data.

Figure 7:
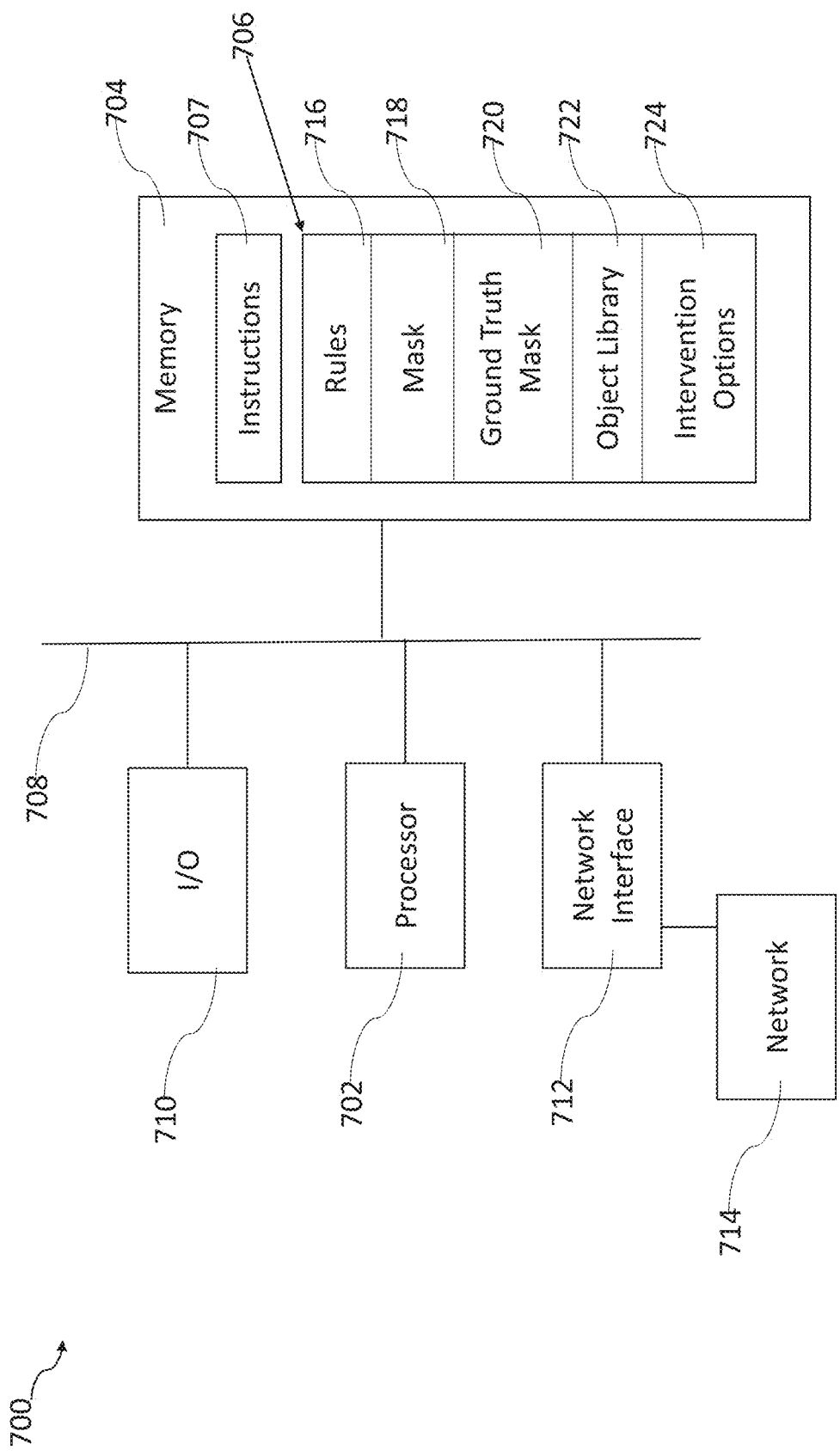
FIG. 7 is a block diagram of a system for implementing a data compression method in accordance with some embodiments.

FIG. 7 is a schematic view of a system 700 for implementing a data compression system and/or a data compression method in accordance with some embodiments. In some embodiments, the system 700 is usable to implement at least portions of the data compression system 100 (FIG. 1). In some embodiments, the system 700 is usable to implement at least portions of the method 200 (FIG. 2), the method 300 (FIG. 3A), the method 400 (FIG. 4), the method 500 (FIG. 5) and/or the method 600 (FIG. 6). System 700 includes a hardware processor 702 and a non-transitory, computer readable storage medium 704 encoded with, i.e., storing, the computer program code 706, i.e., a set of executable instructions. Computer readable storage medium 704 is also encoded with instructions 707 for interfacing with external devices. The processor 702 is electrically coupled to the computer readable storage medium 704 via a bus 708. The processor 702 is also electrically coupled to an input/output (I/O) interface 710 by bus 708. A network interface 712 is also electrically connected to the processor 702 via bus 708. Network interface 712 is connected to a network 714, so that processor 702 and computer readable storage medium 704 are capable of connecting to external elements via network 714. The processor 702 is configured to execute the computer program code 706 encoded in the computer readable storage medium 704 in order to cause system 700 to be usable for performing a portion or all of the operations as described in data compression system 100, method 200, method 300, method 400, method 500 and/or method 600.

In some embodiments, the processor 702 is a central processing unit (CPU), a multi-processor, a distributed processing system, an application specific integrated circuit (ASIC), and/or a suitable processing unit.

In some embodiments, the computer readable storage medium 704 is an electronic, magnetic, optical, electromagnetic, infrared, and/or a semiconductor system (or apparatus or device). For example, the computer readable storage medium 704 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 504 includes a compact disk-read only memory (CD-ROM), a compact disk-read/write (CD-R/W), and/or a digital video disc (DVD).

In some embodiments, the storage medium 704 stores the computer program code 706 configured to cause system 700 to perform a portion or all of the operations as described in data compression system 100, method 200, method 300, method 400, method 500 and/or method 600. In some embodiments, the storage medium 704 also stores information needed for performing a portion or all of the operations as described in data compression system 100, method 200, method 300, method 400, method 500 and/or method 600 as well as information generated during performing a portion or all of the operations as described in data compression system 100, method 200, method 300, method 400, method 500 and/or method 600, such as a rules parameter 716, a mask parameter 718, a ground truth mask parameter 720, an object library parameter 722, an intervention options parameter 724 and/or a set of executable instructions to perform a portion or all of the operations as described in data compression system 100, method 200, method 300, method 400, method 500 and/or method 600.

In some embodiments, the storage medium 704 stores instructions 707 for interfacing with external devices. The instructions 707 enable processor 702 to generate instructions readable by the external devices to effectively implement a portion or all of the operations as described in data compression system 100, method 200, method 300, method 400, method 500 and/or method 600.

System 700 includes I/O interface 710. I/O interface 710 is coupled to external circuitry. In some embodiments, I/O interface 710 includes a keyboard, keypad, mouse, trackball, trackpad, and/or cursor direction keys for communicating information and commands to processor 702.

System 700 also includes network interface 712 coupled to the processor 702. Network interface 712 allows system 700 to communicate with network 714, to which one or more other computer systems are connected. Network interface 712 includes wireless network interfaces such as BLUETOOTH, Wireless Fidelity (WIFI), Worldwide Interoperability for Microwave Access (WIMAX), General Packet Radio Service (GPRS), or Wideband Code Division Multiple Access (WCDMA); or wired network interface such as ETHERNET, Universal Serial Bus (USB), or IEEE-1394 (Institute of Electrical and Electronics Engineers-1394). In some embodiments, a portion or all of the operations as described in data compression system 100, method 200, method 300, method 400, method 500 and/or method 600 is implemented in two or more systems 700, and information is exchanged between different systems 700 via network 714.

Supplemental Note:

An aspect of this description relates to a system. The system includes a non-transitory computer readable medium configured to store instructions thereon; and a processor connected to the non-transitory computer readable medium. The processor is configured to execute the instructions for generating a mask based on received data from a sensor, wherein the mask includes a plurality of importance values, and each region of the received data is designated a corresponding importance value of the plurality of importance values. The processor is further configured to execute the instructions for encoding the received data based on the mask. The processor is further configured to execute the instructions for transmitting the encoded data to a decoder for defining reconstructed data. The processor is further configured to execute the instructions for computing a loss based on the reconstructed data, the received data and the mask. The processor is further configured to execute the instructions for providing training to an encoder for encoding the received data based on the computed loss.

In some embodiments, the processor is further configured to execute the instructions for decoding the received data to define the reconstructed data.

In some embodiments, the processor is further configured to execute the instructions for generating the mask based on a proximity of detected objects to the sensor.

In some embodiments, the processor is further configured to execute the instructions for generating the mask based on detected movement of detected objects based on the received data.

In some embodiments, the processor is further configured to execute the instructions for generating the mask based on a classification of each of the detected objects in the received data.

In some embodiments, the processor is further configured to execute the instructions for generating a ground truth mask based on the received data and ground truth segments.

In some embodiments, the processor is further configured to execute the instructions for computing the loss further based on the ground truth mask.

In some embodiments, the processor is further configured to execute the instructions for detecting objects in the reconstructed data.

In some embodiments, the processor is further configured to execute the instructions for computing the loss further based on the detected objects in the reconstructed data.

An aspect of this description relates to a method. The method includes generating a mask, using a processor, based on received data from a sensor, wherein the mask includes a plurality of importance values, and each region of the received data is designated a corresponding importance value of the plurality of importance values. The method further includes encoding the received data based on the mask. The method further includes transmitting the encoded data to a decoder for defining reconstructed data. The method further includes computing a loss based on the reconstructed data, the received data and the mask. The method further includes providing training to an encoder for encoding the received data based on the computed loss.

In some embodiments, the method further includes decoding the received data to define the reconstructed data.

In some embodiments, generating the mask includes generating the mask based on a proximity of detected objects to the sensor.

In some embodiments, generating the mask includes generating the mask based on detected movement of detected objects based on the received data.

In some embodiments, generating the mask includes generating the mask based on a classification of each of the detected objects in the received data.

In some embodiments, the method further includes generating a ground truth mask based on the received data and ground truth segments.

In some embodiments, computing the loss further includes computing the loss based on the ground truth mask.

In some embodiments, the method further includes detecting objects in the reconstructed data.

In some embodiments, computing the loss further includes computing the loss based on the detected objects in the reconstructed data.

An aspect of this description relates to a system. The system includes a sensor configured to collect data. The system further includes a non-transitory computer readable medium configured to store instructions and rules. The system further includes a processor connected to the non-transitory computer readable medium. The processor is configured to execute the instructions for generating a mask based on the stored rules and the collected data. The system further includes an encoder configured to encode the collected data based on the mask. The system further includes a decoder configured to decode information received from the encoder to define reconstructed data. The processor is further configured to execute the instructions for computing a loss based on the reconstructed data, the collected data and the mask; and updating at least one of the encoder or the decoder based on the computed loss.

In some embodiments, the sensor includes a light detection and ranging (LiDAR) sensor.

An aspect of this description relates to a system. The system includes a sensor configured to collect data. The system further includes a non-transitory computer readable medium configured to store instructions and rules. The system further includes a processor connected to the non-transitory computer readable medium. The processor is configured to execute the instructions for generating a mask based on the stored rules and the collected data. The system further includes an encoder configured to encode the collected data based on the mask. The system further includes a decoder configured to decode information received from the encoder to define reconstructed data. The processor is further configured to execute the instructions for computing a loss based on the reconstructed data, the collected data and the mask; and updating at least one of the encoder or the decoder based on the computed loss.

In some embodiments, the sensor includes a light detection and ranging (LiDAR) sensor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In some embodiments, the processor comprises a plurality of processors, a first processor of the plurality of processors is at an encoder location, and a second processor of the plurality of processors is at a decoder location different from the encoder location.

What is claimed is:

1. A system comprising:
   a non-transitory computer readable medium configured to store instructions thereon; and
   a processor connected to the non-transitory computer readable medium, wherein the processor is configured to execute the instructions for:
      generating a mask based on received data from a sensor, wherein the mask includes a plurality of importance values, and each region of the received data is designated a corresponding importance value of the plurality of importance values;
      encoding the received data based on the mask;
      transmitting the encoded data to a decoder for defining reconstructed data;
      computing a loss based on the reconstructed data, the received data and the mask; and
      providing training to an encoder for encoding the received data based on the computed loss.

2. The system according to claim 1, wherein the processor is further configured to execute the instructions for:
   decoding the received data to define the reconstructed data.

3. The system according to claim 1, wherein the processor is further configured to execute the instructions for:
generating the mask based on a proximity of detected objects to the sensor.

4. The system according to claim 1, wherein the processor is further configured to execute the instructions for:
generating the mask based on detected movement of detected objects based on the received data.

5. The system according to claim 1, wherein the processor is further configured to execute the instructions for:
generating the mask based on a classification of each of the detected objects in the received data.

6. The system according to claim 1, wherein the processor is further configured to execute the instructions for:
generating a ground truth mask based on the received data and ground truth segments.

7. The system according to claim 6, wherein the processor is further configured to execute the instructions for:
computing the loss further based on the ground truth mask.

8. The system according to claim 1, wherein the processor is further configured to execute the instructions for:
detecting objects in the reconstructed data.

9. The system according to claim 8, wherein the processor is further configured to execute the instructions for:
computing the loss further based on the detected objects in the reconstructed data.

10. The system according to claim 1, wherein the sensor comprises a light detection and ranging (LiDAR) sensor.

11. The system according to claim 1, wherein the processor comprises a plurality of processors, a first processor of the plurality of processors is at an encoder location, and a second processor of the plurality of processors is at a decoder location different from the encoder location.

12. A method comprising:
generating a mask, using a processor, based on received data from a sensor, wherein the mask includes a plurality of importance values, and each region of the received data is designated a corresponding importance value of the plurality of importance values;
encoding the received data based on the mask;
transmitting the encoded data to a decoder for defining reconstructed data;
computing a loss based on the reconstructed data, the received data and the mask; and
providing training to an encoder for encoding the received data based on the computed loss.

13. The method according to claim 12, further comprising:
decoding the received data to define the reconstructed data.

14. The method according to claim 12, wherein generating the mask comprises generating the mask based on a proximity of detected objects to the sensor.

15. The method according to claim 12, wherein generating the mask comprises generating the mask based on detected movement of detected objects based on the received data.

16. The method according to claim 12, wherein generating the mask comprises generating the mask based on a classification of each of the detected objects in the received data.

17. The method according to claim 12, further comprising:
generating a ground truth mask based on the received data and ground truth segments.

18. The method according to claim 17, wherein computing the loss further comprises computing the loss based on the ground truth mask.

19. The method according to claim 18, further comprising:
detecting objects in the reconstructed data.

20. The method according to claim 19, wherein computing the loss further comprises computing the loss based on the detected objects in the reconstructed data.

* * * * *